(12) United States Patent
Lopez et al.

(10) Patent No.: US 9,319,018 B2
(45) Date of Patent: Apr. 19, 2016

(54) DETECTION OF RADIO SIGNALS IN A RECEIVER

(75) Inventors: Miguel Lopez, Solna (SE); Kenneth Sandberg, Ekerö (SE)

(73) Assignee: TELEFONAKTIEBOLAGET L M ERICSSON (PUBL), Stockholm (SE)

( * ) Notice: Subject to any disclaimer, the term of this patent is extended or adjusted under 35 U.S.C. 154(b) by 29 days.

(21) Appl. No.: 13/512,302

(22) PCT Filed: Dec. 4, 2009

(86) PCT No.: PCT/SE2009/051380
§ 371 (c)(1),
(2), (4) Date: Aug. 3, 2012

(87) PCT Pub. No.: WO2011/068449
PCT Pub. Date: Jun. 9, 2011

(65) Prior Publication Data
US 2013/0016799 A1 Jan. 17, 2013

(51) Int. Cl.
*H03D 1/04* (2006.01)
*H03G 3/30* (2006.01)
*H03M 13/39* (2006.01)
*H03M 13/41* (2006.01)

(52) U.S. Cl.
CPC ........... *H03G 3/3068* (2013.01); *H03G 3/3073* (2013.01); *H03G 3/3078* (2013.01); *H03M 13/3905* (2013.01); *H03M 13/41* (2013.01); *H03M 13/4138* (2013.01); *H03M 13/4146* (2013.01)

(58) Field of Classification Search
USPC .......................................... 375/341, 340, 316
See application file for complete search history.

(56) References Cited

U.S. PATENT DOCUMENTS

| | | | |
|---|---|---|---|
| 4,191,995 A | 3/1980 | Farrow | |
| 5,625,360 A * | 4/1997 | Garrity | ............... H03M 1/0863 341/144 |
| 6,631,175 B2 * | 10/2003 | Harikumar | ........ H04L 25/03012 375/232 |
| 7,353,010 B1 | 4/2008 | Zhang et al. | |
| 8,416,866 B1 * | 4/2013 | Cheng | ................. H04L 25/0204 375/232 |

(Continued)

FOREIGN PATENT DOCUMENTS

EP 1655834 A2 5/2006

OTHER PUBLICATIONS

Koch, W. et al. "Optimum and sub-optimum detection of coded data disturbed by time varying intersymbol interference", Global Telecommunications Conference, 1990, and Exhibition. IEEE GLOBECOM 90, Dec. 1990, pp. 1679-1684, vol. 3. IEEE, Piscataway, NJ.

(Continued)

*Primary Examiner* — Adolf Dsouza
(74) *Attorney, Agent, or Firm* — Coats & Bennett, PLLC (57) ABSTRACT

Non-linear distortions, called glitches, occur in radio receivers when automatic gain control (AGC) is employed for regulating the dynamic range of the received signal. It is proposed to determine (S1) the occurrence of a glitch caused by operation of the AGC mechanism, and estimate (S2) a representation of how energy of a signal transient associated with the glitch is transferred by digital filter(s) in the receiver. The radio signal is then detected (S3) at least partly based on the estimated representation. In this way, the adverse effects of the glitch can be mitigated and detection of the desired signal can be significantly improved. This also means that the link performance will be significantly improved.

27 Claims, 10 Drawing Sheets

(56) References Cited

U.S. PATENT DOCUMENTS

| | | | |
|---|---|---|---|
| 2003/0025914 A1* | 2/2003 | Demarest | 356/500 |
| 2003/0143967 A1 | 7/2003 | Ciccarelli et al. | |
| 2006/0126702 A1* | 6/2006 | Burdett | H04B 1/30 375/136 |
| 2008/0039042 A1* | 2/2008 | Ciccarelli | H04B 1/109 455/234.1 |
| 2008/0137784 A1 | 6/2008 | Krone | |
| 2009/0022246 A1* | 1/2009 | Ando | H04B 1/0067 375/319 |

OTHER PUBLICATIONS

Viterbi, A. J., "An intuitive justification and a simplified implementation of the MAP decoder for convolutional codes", IEEE Journal of Selected Areas in Communications, vol. 16, No. 2, pp. 260-264, Feb. 1998. IEEE, Piscataway, NJ.

Häring, J. et al., "Performance Bounds for Optimum and Suboptimum Reception under Class-A Impulsive Noise." IEEE Transactions on Communications, vol. 50, No. 7, pp. 1130-1136, Jul. 2002. IEEE, Piscataway, NJ.

Ichihara, M. et al. "Gain Control Methods for Analog Base Band Circuit in Direct Conversion W-CDMA Receiver." 2002 IEEE Wireless Communications and Networking Conference, vol. 1, Mar. 17-21, 2002, pp. 164-168. IEEE, Piscataway, NJ.

Jeon, T. et al. "Hardware Efficient Viterbi Detection for Jitter Dominant Channel." 2000 IEEE International Magnetics Conference, INTERMAG 2000 Digest of Technical Papers, Apr. 4-8, 2005, p. 679. IEEE, Piscataway, NJ.

U.S. Appl. No. 61/155,671, filed Feb. 26, 2009.

* cited by examiner

DETECTION OF RADIO SIGNALS IN A RECEIVER

TECHNICAL FIELD

The present invention generally relates to radio communications technology, and more particularly to a method and detector for detecting a radio signal in a radio receiver, as well as a radio receiver.

BACKGROUND

In radio communication technologies, blocking and interference are some of the main system killers. They can for example occur when an interfering signal, having a center of frequency different from the desired signal carrier frequency is very strong.

Many receivers, such as for wideband radio, employ a so-called Automatic Gain Control (AGC) mechanism for regulating the dynamic range of the received signals, for example in order to prevent saturation of the receiver when a strong signal is present. The received signal power can be measured at a suitable location in the receiver and the gain of a Variable Gain Amplifier (VGA) may then be controlled based on the power measurements. In particular, the AGC mechanism provides means to temporarily reduce the gain of a variable amplifier in case strong interfering signals are received.

However, when the AGC mechanism is turned on or off, or when a gain adjustment is effectuated, unwanted transient signals are generated. These transients can be highly energetic, and introduce non-linear distortions, commonly called glitches, in the useful part of the desired signal. The desired signal is thereby heavily distorted and a number of samples of the digital received signal are corrupted. The result is a loss of link performance. When the code rate is very high, just a few bit errors will result in block or frame errors, and the performance loss in terms of block or frame error rates can be very large. Glitches also affect voice services, and they also result in some performance loss.

SUMMARY

It is a general object to provide efficient detection of a radio signal in a radio receiver having an automatic gain control (AGC) mechanism for regulating the dynamic range of the received signal.

It is a specific object to provide a method for detecting a radio signal in a receiver having an automatic gain control (AGC) mechanism.

It is another specific object to provide a detector operable for detecting a radio signal in a receiver having an automatic gain control (AGC) mechanism.

Yet another object is to provide an improved radio receiver.

These and other objects are met by embodiments as defined by the accompanying patent claims.

A basic idea according to a first aspect is to determine the occurrence of a glitch caused by operation of the AGC mechanism, estimate a representation of how energy of a signal transient associated with the glitch is transferred by at least one digital filter in the receiver, and then detect the radio signal at least partly based on the estimated representation.

In this way, the adverse effects of the glitch can be mitigated and detection of the desired signal can be significantly improved. This also means that the link performance will be significantly improved.

According to a second aspect there is provided a detector operable for detecting a radio signal in a receiver having an AGC mechanism for regulating the dynamic range of the received signal. The detector is adapted for obtaining information representative of how energy of a signal transient associated with a glitch, caused by operation of the AGC mechanism, is transferred by at least one digital filter in the receiver, and adapted for detecting the radio signal at least partly based on the obtained information.

According to a third aspect, there is provided a radio receiver comprising an analog radio frequency (RF) front end having an automatic gain control (AGC) mechanism for regulating the dynamic range of a received signal, an analog-to-digital (A/D) converter for converting output signals from said analog RF front end into digital form, and a digital processing unit including at least one digital filter in the output path of the A/D converter. The radio receiver further comprises an estimator adapted for estimating a representation of how energy of a signal transient associated with a glitch, caused by operation of the AGC mechanism, is transferred by the digital filter(s) in the digital processing unit, and a detector, in the output path of the digital filter processing unit, configured for operation at least partly based on the estimated representation of how energy of a signal transient associated with a glitch is transferred by the digital filter(s).

Other advantages offered by the invention will be appreciated when reading the below description of embodiments of the invention.

BRIEF DESCRIPTION OF THE DRAWINGS

The invention, together with further objects and advantages thereof, may best be understood by making reference to the following description taken together with the accompanying drawings, in which.

DETAILED DESCRIPTION

Throughout the drawings, the same reference numbers are used for similar or corresponding elements.

It may be useful to begin with a brief overview of some basic aspects of radio receiver technology.

Figure 1:
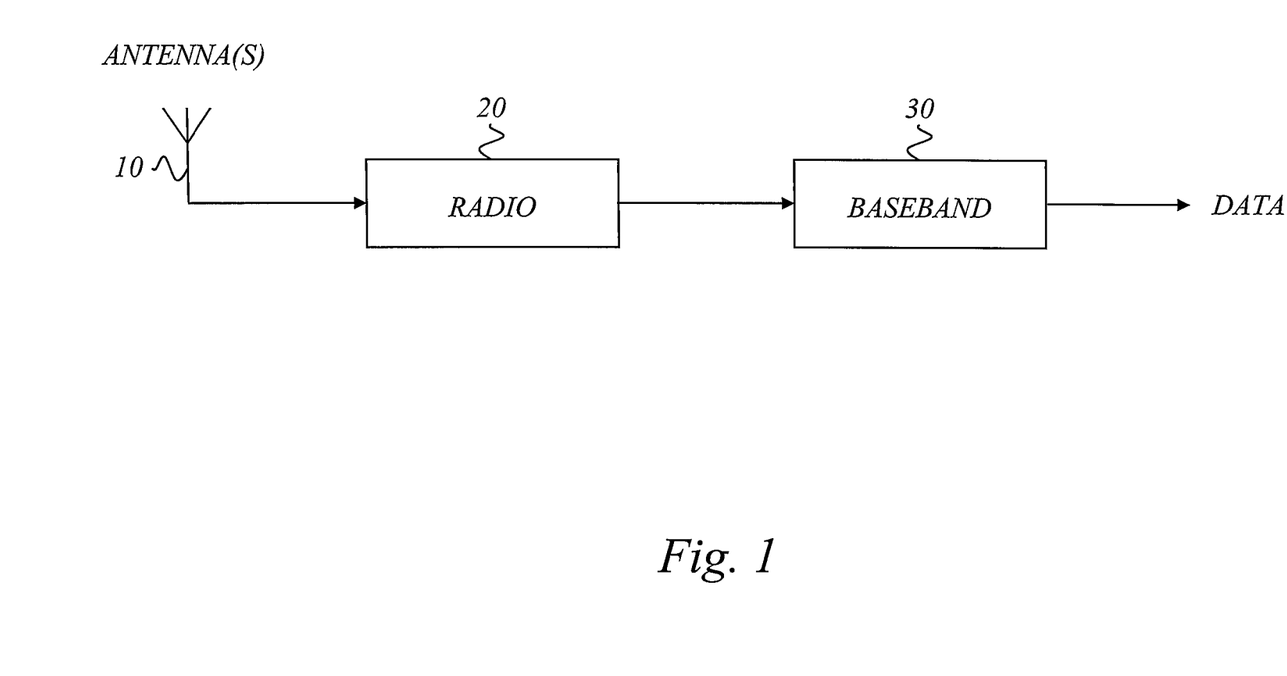
FIG. 1 is a schematic overview of an exemplary radio receiver.

In a digital radio communications system, a receiver typically includes one or more antennas 10, a radio part 20 and a baseband part 30, as schematically illustrated in FIG. 1. The receiver generally also includes an analog part and a digital part (not explicitly shown in FIG. 1), using an Analog-to-Digital Converter (ADC) for converting analog signals into digital signals.

Figure 2:
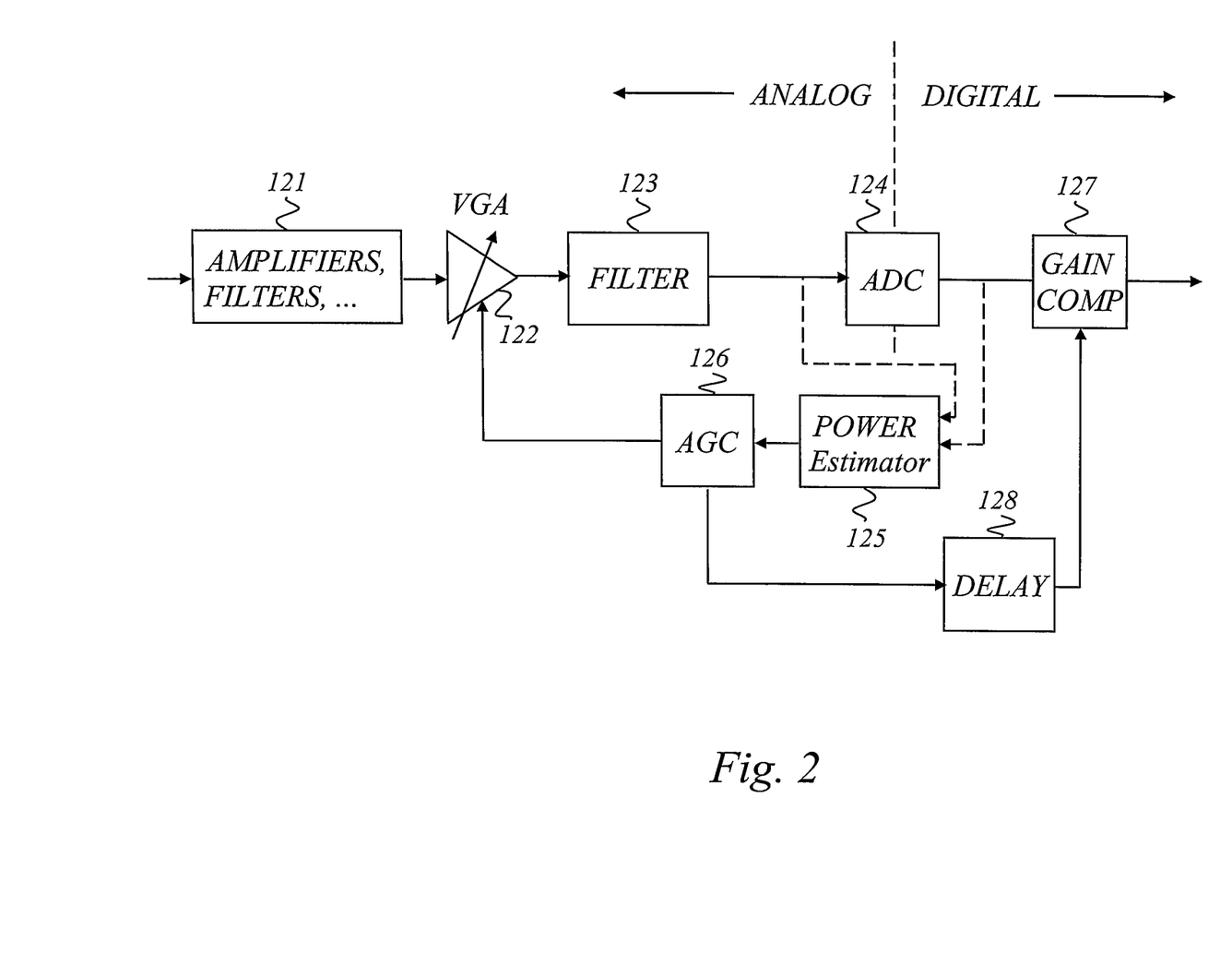
FIG. 2 is a schematic block diagram illustrating an example of some functional units relevant for the AGC mechanism in a radio receiver.

FIG. 2 is a schematic block diagram illustrating an example of some functional units relevant for the AGC mechanism in a radio receiver. In this example, the functional units include amplifiers, analog filters and mixers 121, a VGA amplifier 122, one or more additional filters 123, an ADC 124, a power estimator 125, and an AGC controller 126, a gain compensator 127 and a delay unit 128.

The received signal is passed through the analog part of the radio receiver including amplifiers, analog filters and/or mixers 121. For the purpose of regulating the dynamic range of the received signals, for example in order to prevent saturation of the receiver when a strong signal is present, the received signal is forwarded to the VGA amplifier 122, the gain of which is controlled by the AGC controller 126 based on power measurements made by the power estimator 125. For example, the signal power can be measured before or after the ADC 124. Alternatively, the power measurements of the received signal may be performed earlier in the analog radio chain. It is even possible to estimate the power of the received signals at several locations, if desired.

Figure 3A:
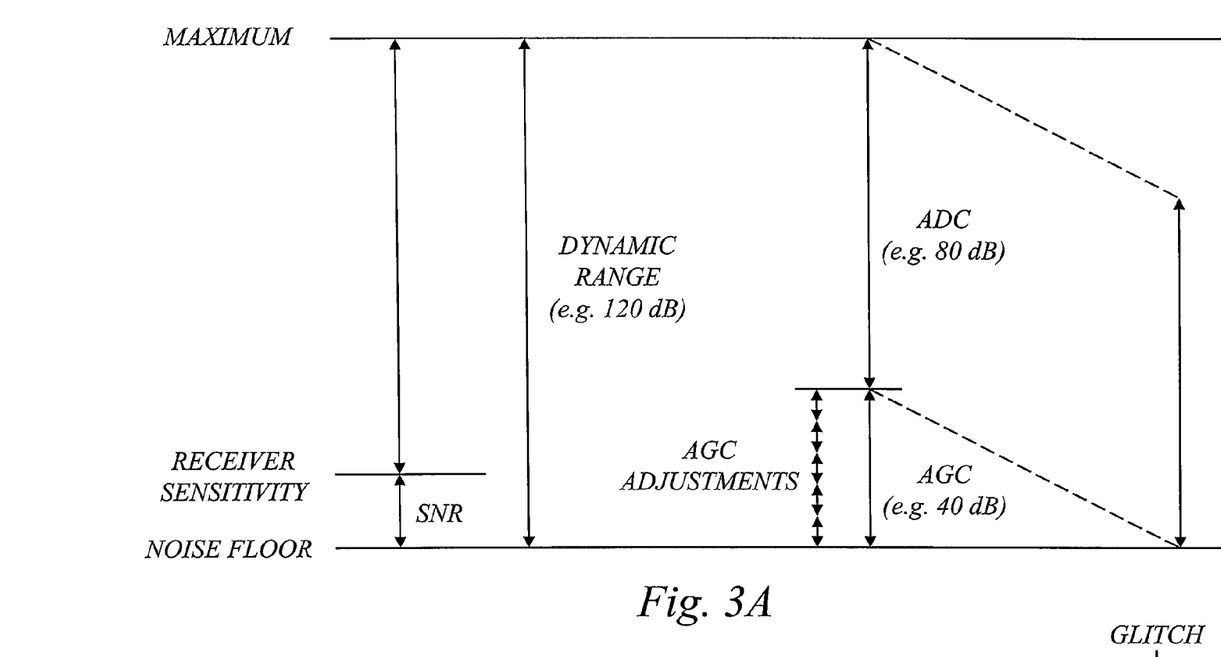
FIG. 3A is a schematic diagram illustrating dynamic ranges of a receiver, an ADC and the relevance of the AGC mechanism.

The dynamic range is normally defined as the range between the noise floor of a device and its specified maximum output level. With reference to the schematic example of FIG. 3A, the dynamic range of the received signals may be e.g. 120 dB, whereas the ADC has a limited dynamic range, e.g. 80 dB. By employing the overall AGC mechanism (e.g. 40 dB) it is possible to regulate the dynamic range of the received signals. It is important that the gain of the VGA amplifier is customized for the typical powers of the received signals and the range of the ADC. Normally, the gain of the VGA amplifier may be adjusted in steps; so-called gain adjustments or AGC adjustments.

Figure 3B:
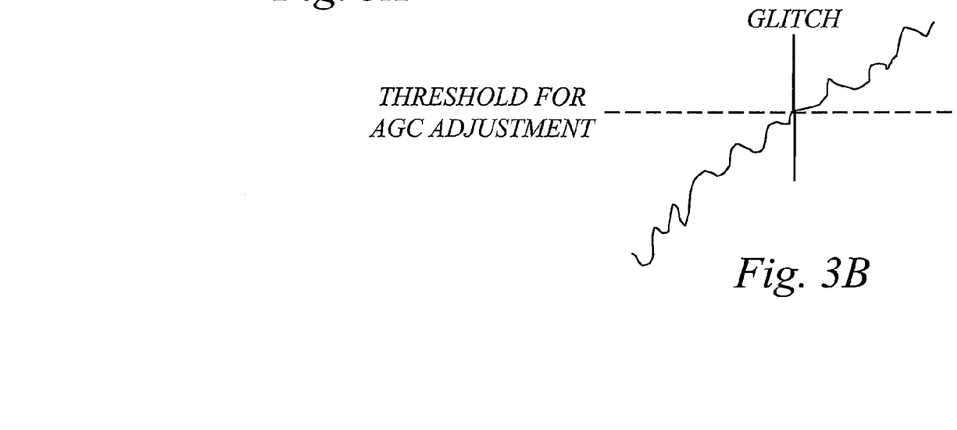
FIG. 3B illustrates an example of the occurrence of a glitch caused by the AGC operation.

In order for the receiver to work properly, the gain adjustment is normally compensated after the ADC, so-called gain compensation by the gain compensator 127. However, if there are filters 123 between the VGA amplifier 122 and the ADC 124, the gain will not be perfectly compensated but there will be transients (so-called AGC glitches) within a very short time after a gain adjustment, as illustrated in FIG. 3B.

Figure 4:
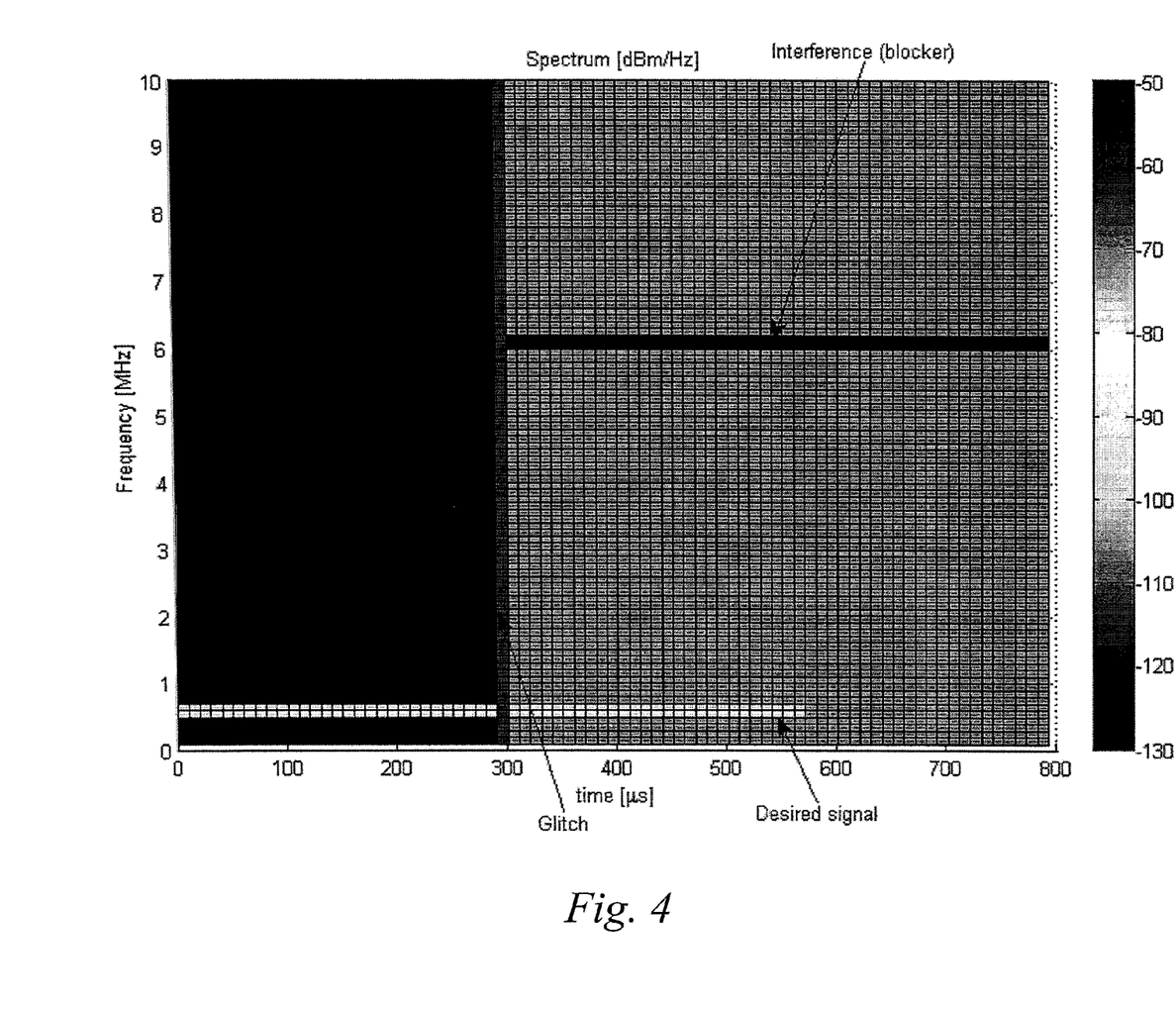
FIG. 4 is a signal diagram illustrating an example of the occurrence of a glitch in the presence of a strong interfering signal.

FIG. 4 is also a signal diagram illustrating an example of the occurrence of a glitch in the presence of a strong interfering signal. As mentioned, the desired signal is thereby heavily distorted and a number of samples of the digital received signal are corrupted. The result is a loss of link performance. The AGC glitches will degrade the sensitivity of the receiver, and the degradation may be up to several dBs.

When the code rate is very high (one or near one), just a few bit errors will result in block or frame errors, and the performance loss in terms for block or frame error rates can be very large. Modulation and coding schemes with high code rates are among the most commonly used in for example GSM. Moreover, it is well known that blocking does occur in GSM networks and can not be neglected. Glitches also affect voice services.

The inventors have recognized that when a glitch occurs, the usual methods of modeling the received signal as a superposition of desired signal, interference and noise do not capture the occurrence of short, non-linear, non-stationary distortions. Instead, it is proposed to analyze the digital receiver chain and estimate how energy of a signal transient associated with the glitch is transferred by digital filter(s) in the receiver chain. It has turned out that the adverse effects of the glitch can be mitigated and detection of the desired signal can be significantly improved by using this so-called energy transfer estimate as input in the detection process. This also means that the link performance will be significantly improved. This is especially important in the case of signals with high code rates/high data rates, since a blocking interferer can cause a quite high error floor.

Figure 5:
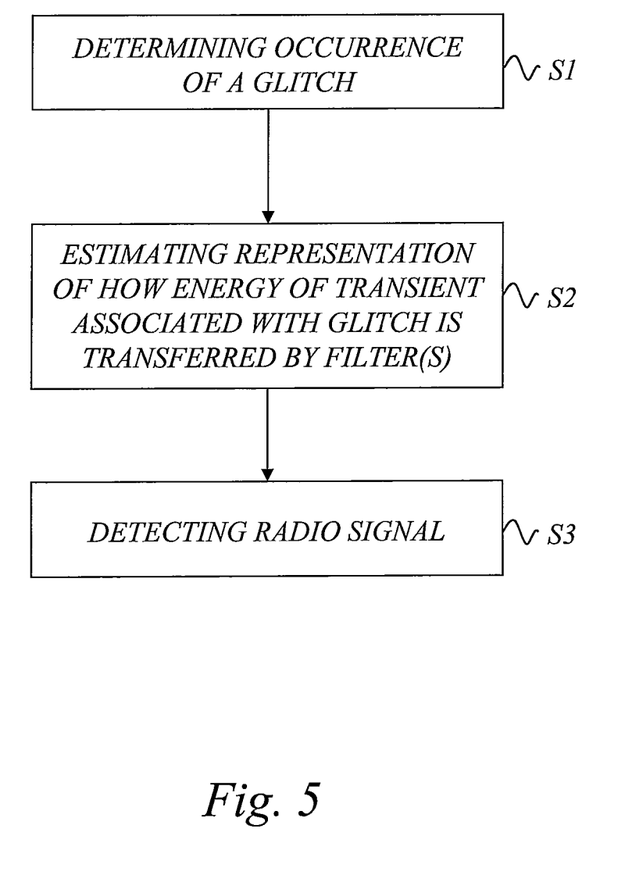
FIG. 5 is a schematic flow diagram illustrating a method for detecting a radio signal according to an exemplary embodiment.

FIG. 5 is a schematic flow diagram illustrating a method for detecting a radio signal according to an exemplary embodiment. Step S1 includes determining the occurrence of a glitch caused by operation of the AGC mechanism. Step S2 includes estimating a representation of how energy of a signal transient associated with the glitch is transferred by at least one digital filter in the receiver. Step S3 includes detecting the desired radio signal at least partly based on the estimated representation.

In an exemplary embodiment, the occurrence of a glitch is determined in response to an AGC adjustment of the AGC mechanism. In other words, when the AGC mechanism is turned on or off, and/or the gain is adjusted, it is concluded that a glitch will occur. In an alternative exemplary embodiment, the occurrence of a glitch is determined by a glitch detector arranged externally to the AGC mechanism.

In general, the considered signal transient may be the glitch itself and/or a signal transient caused by additional processing of the glitch in the receiver.

The signal transient may thus include the actual glitch caused by operation of the AGC mechanism. Alternatively, the glitch is processed in the receiver, and the signal transient then normally includes a signal transient caused by the processing of the glitch. For example, the processing of the glitch may include glitch damping such as glitch suppression, wherein the glitch damping at least partly contributes to the signal transient that occurs.

For example, in glitch suppression the idea is to set the gain to zero in the gain compensation or thereafter during the glitch. This partly reduces the error in the signal caused by the transients if the transients are significantly stronger than the wanted signal. In other words, the samples $y_n$ of the signal are set to zero for $n=m_0, \ldots, m_0+M-1$, where M is fixed and $m_0$ is given by the time instant for the glitch. The set of samples set to zero usually correspond to an interval of a few microseconds.

Glitch suppression is thoroughly described in our co-pending patent application [1], which is incorporated herein by reference.

However, although signal processing such as glitch suppression is employed to counteract the effects of the glitch, a signal transient will anyway occur, now due to the processing of the glitch.

By using the present proposal of estimating a representation of how energy of the signal transient is transferred by digital filter(s) in the receiver, and using the estimated representation for detecting the desired radio signal, the effects of the glitch can be handled very effectively.

The term "detection" generally implies demodulation and/or decoding, but normally includes at least detection of modulation symbols.

The invention is generally applicable for handling signal transients associated with glitches caused by AGC operation. However, the proposed technology is of particular interest for improved detection of narrowband signals received through a wideband radio receiver, wherein the detection includes at least demodulation of the received narrowband radio signal.

For example, the narrowband signal may be a Global System for Mobile communications (GSM) signal received through a wideband radio receiver capable of receiving Wideband Code Division Multiple Access (WCDMA) or Long Term Evolution (LTE) radio signals.

In particular, the proposed technology may be of interest for Multi-Standard Radio (MSR). Multi-Standard Radio (MSR) technology is maturing rapidly. The MSR concept includes both existence of more than one communication standard and reception and transmission of multiple carriers in the same receiver and transmitter. Due to the advantages of co-existing radio technologies and migration from older to newer technologies, MSR will be deployed globally. In particular, a narrowband system like GSM, being the incumbent technology, will be deployed using wideband radios like WCDMA or LTE.

Figure 6:
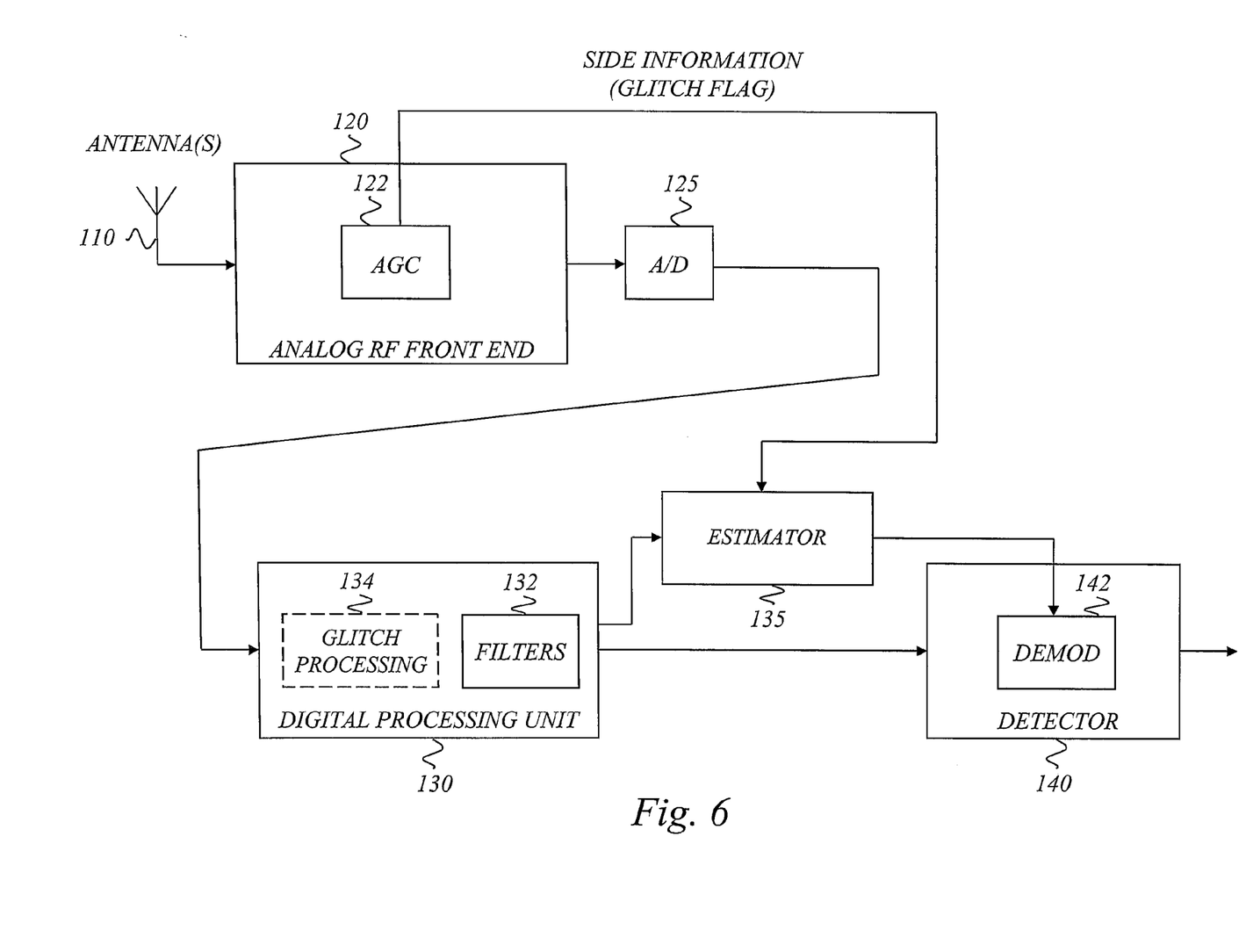
FIG. 6 is a schematic block diagram illustrating a radio receiver according to an exemplary embodiment.

FIG. 6 is a schematic block diagram illustrating a radio receiver according to an exemplary embodiment. Basically, the radio receiver comprises a set of one or more antennas 110, an analog radio frequency (RF) front end 120, and A/D-converter or ADC 125, a digital processing unit 130, an estimator 135, and a detector 140.

In addition to amplifiers, filters and mixers (not shown), the analog RF front end includes an AGC mechanism 122 for moving the input signal into the appropriate dynamic range. In this particular example, when an AGC adjustment occurs, so-called side information indicating the occurrence of a glitch is transferred from AGC mechanism 122 to the estimator 135. The side information may for example be in the form of a glitch flag corresponding to each sample that is affected by the glitch.

The ADC 125 is adapted for converting the output signals from the analog RF front end 120 into digital form.

The digital processing unit 130 includes one or more digital filters 132 in the output path of the ADC 125, and an optional glitch processing unit 134.

The optional glitch processing unit 134 is adapted for processing the glitch, and may effectuate some form of glitch damping or glitch suppression, keeping in mind that the glitch damping or glitch suppression will anyway result in a signal transient.

The estimator 135 is adapted for estimating a representation of how energy of a signal transient associated with the glitch, caused by operation of the AGC mechanism 122, is transferred by the digital filter(s) 132 in the digital processing unit 130. The estimator 135 employs the side information from the AGC mechanism 122 as input for the estimation so that it is known which samples are affected by the glitch. For example, the estimator may be adapted for estimating an approximation of a glitch-related non-stationary noise spectrum.

The detector 140 is arranged in the output path of the digital filter processing unit 130, and is adapted for receiving information on the estimated energy transfer representation from the estimator 135. The detector 140 normally includes a demodulator 142, such as a time-dependent demodulator, which is configured for operation at least partly based on the estimated representation of how energy of a signal transient associated with the glitch is transferred by the digital filter(s).

If several wanted signals are received simultaneously through a plurality of antenna branches, the signals may be processed in parallel using filter banks in the digital processing unit. The plurality of signals may be jointly demodulated/equalized, and demodulated soft or hard bits from the demodulator/equalizer may then, depending on the desired implementation, be sent for decoding.

Figure 7:
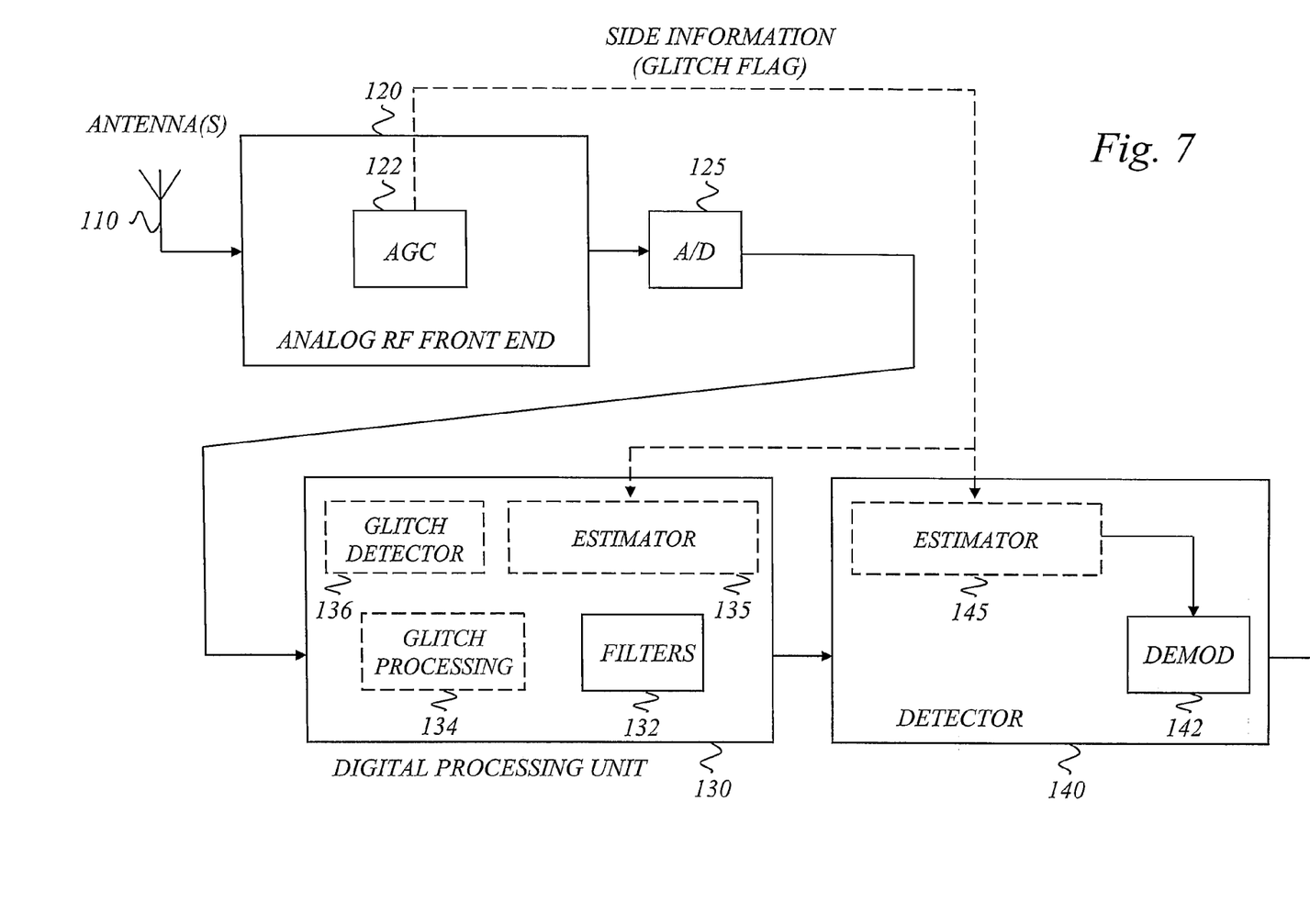
FIG. 7 is a schematic block diagram illustrating a radio receiver according to another exemplary embodiment.

FIG. 7 is a schematic block diagram illustrating a radio receiver according to another exemplary embodiment. In this particular example, the alternative possibility of using an external glitch detector for determining the occurrence of a glitch is illustrated. For example, a glitch detector 136 may be implemented in the digital processing unit 130. The glitch detector 136 is typically adapted for transferring information representative of detection of a glitch to the estimator.

It is also indicated in FIG. 7, that the estimator for estimating a representation of how energy of the signal transient is transferred by the digital filter(s) may be integrated in the digital processing unit 130 as an estimator 135 or integrated in the detector 140 as an estimator 145.

Figure 8:
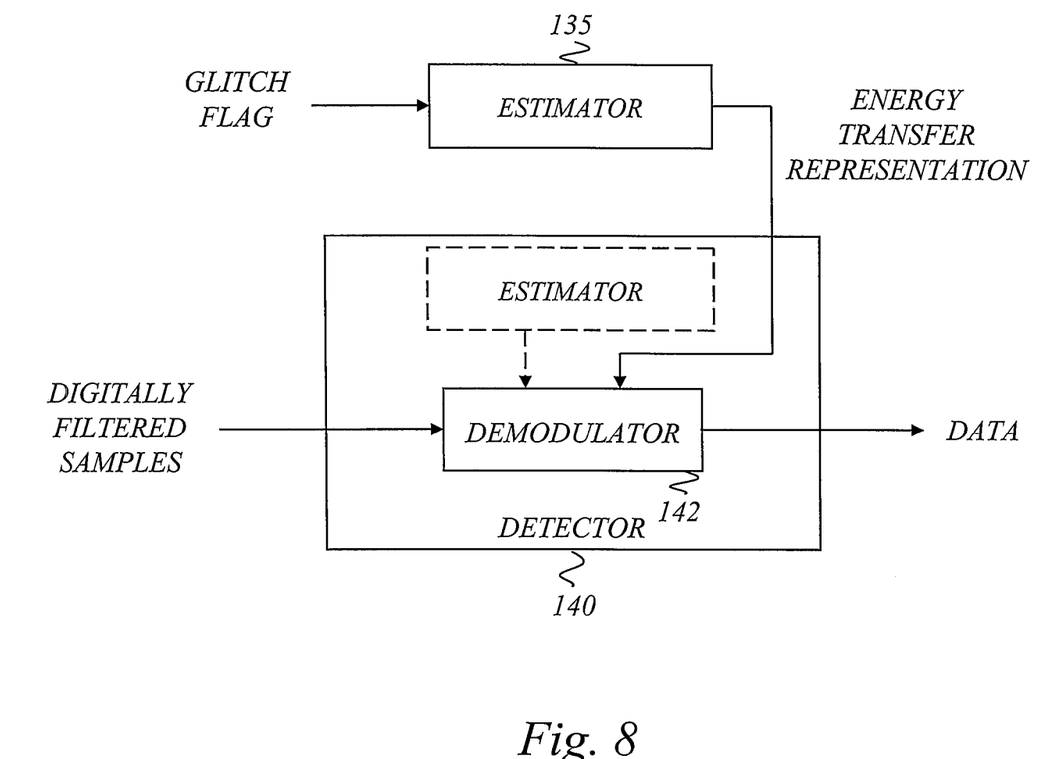
FIG. 8 is a schematic block diagram illustrating a detector according to an exemplary embodiment.

FIG. 8 is a schematic block diagram illustrating a detector according to an exemplary embodiment. Basically, the detector 140 is adapted for obtaining information representative of how energy of a signal transient associated with the glitch is transferred by at least one digital filter in the receiver, and adapted for detecting the desired radio signal at least partly based on the obtained information. In this particular example, the detector 140 includes a demodulator 142, which receives digitally filtered samples as input for detecting modulation symbols. In the detection process, the so-called energy transfer representation will be used to improve the detection efficiency. In a first alternative, the detector 140 has an input for receiving the information representative of how energy of a signal transient associated with the glitch is transferred from an estimator 135 located outside of the detector 140. In a second alternative, the estimator is integrated in the detector 140.

The detector 140 preferably includes a time-dependent detector/demodulator 142 for detecting/demodulating the received radio signal. This may for example be a time-dependent maximum-a-posteriori (MAP) detector or a time-dependent Viterbi detector.

In particular, the above-described receivers and/or detectors may be suited for detection of narrowband signals such as GSM signals received through a wideband radio receiver such as WCDMA, LTE or MSR receiver.

For a better understanding of the proposed technology, it may be useful to describe some exemplary embodiments in more detail. It should though be understood that the following embodiments are merely given as non-limiting examples.

It is generally desirable to obtain optimum or near-optimum detectors, e.g. for narrowband signals received through wideband radios. When a glitch occurs, the usual methods of modeling the baseband received signal as the superposition of a desired signal, interference and noise, do not capture the occurrence of short, non-linear, non-stationary distortions.

By analyzing the digital receiver chain, it is possible to estimate how the glitch energy, or more generally the energy of the considered signal transient, is spread over the burst by the digital filter(s) (e.g. channel filter). In this way, an approximation of a glitch-related noise spectrum can be estimated. Moreover, narrowband signals normally suffer from Inter-Symbol-Interference (ISI). Because of this, the desired signal can be modeled as a superposition of echoes of the transmitted signal (ISI) plus non-stationary noise (thermal noise/interference plus glitch). Hence, it is possible to partially recover the information in the part of the signal distorted by the glitch, by using the echoes in the non-distorted part of the signal and taking into account the noise power due to the glitch. For this purpose, a time-dependent maximum-a-posteriori detector or a time-dependent Viterbi detector can for example be used. The invention can be implemented digitally in the baseband.

For simplicity, the invention shall now be described for a single branch receiver, with reference to the illustrative examples of FIGS. 9 and 10. Moreover, we shall consider digital signals sampled at the symbol rate. The extension to multiple branches or higher sampling rates is straightforward.

Figure 9:
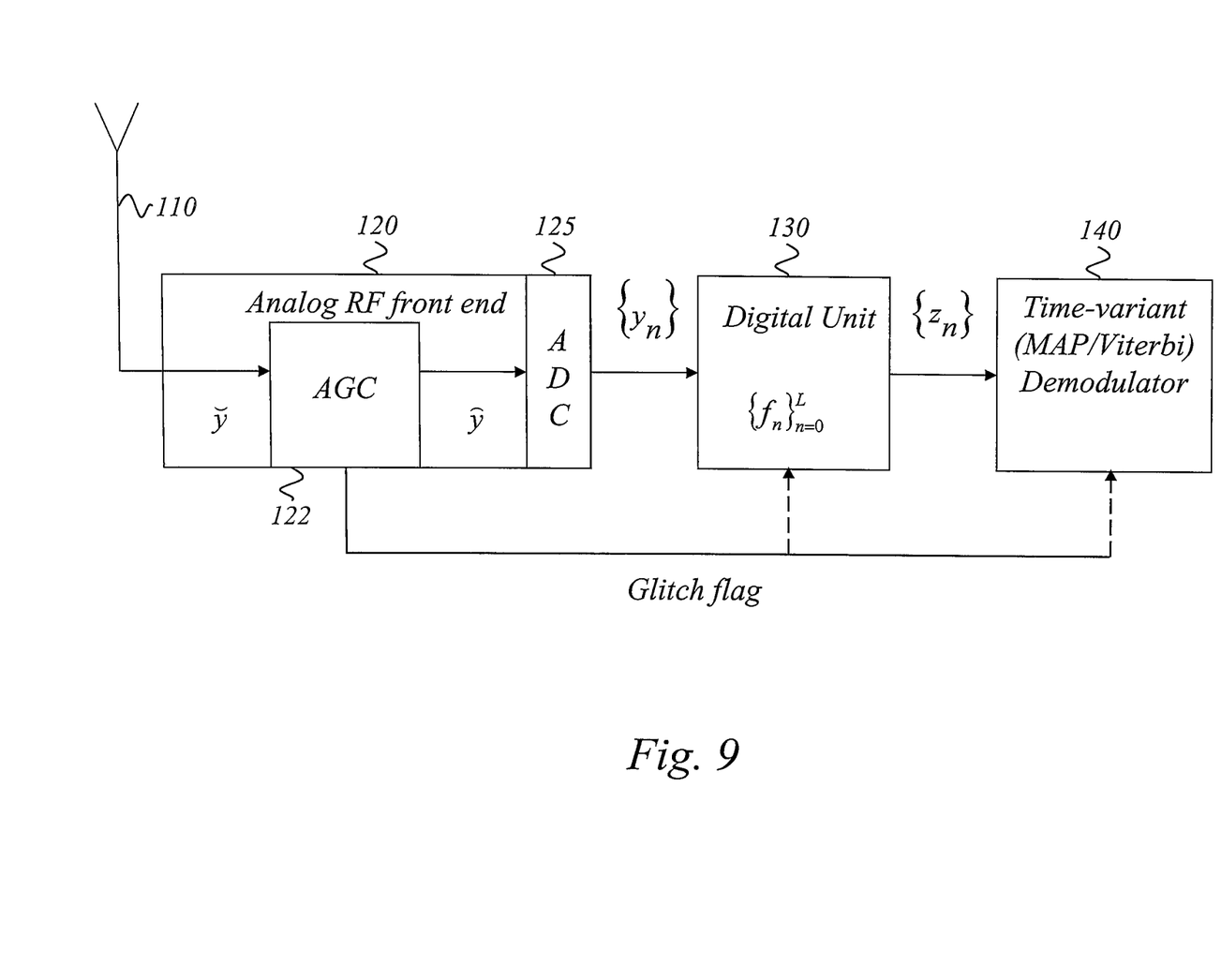
FIG. 9 is a schematic block diagram illustrating a radio receiver according to yet another exemplary embodiment.
Figure 10:
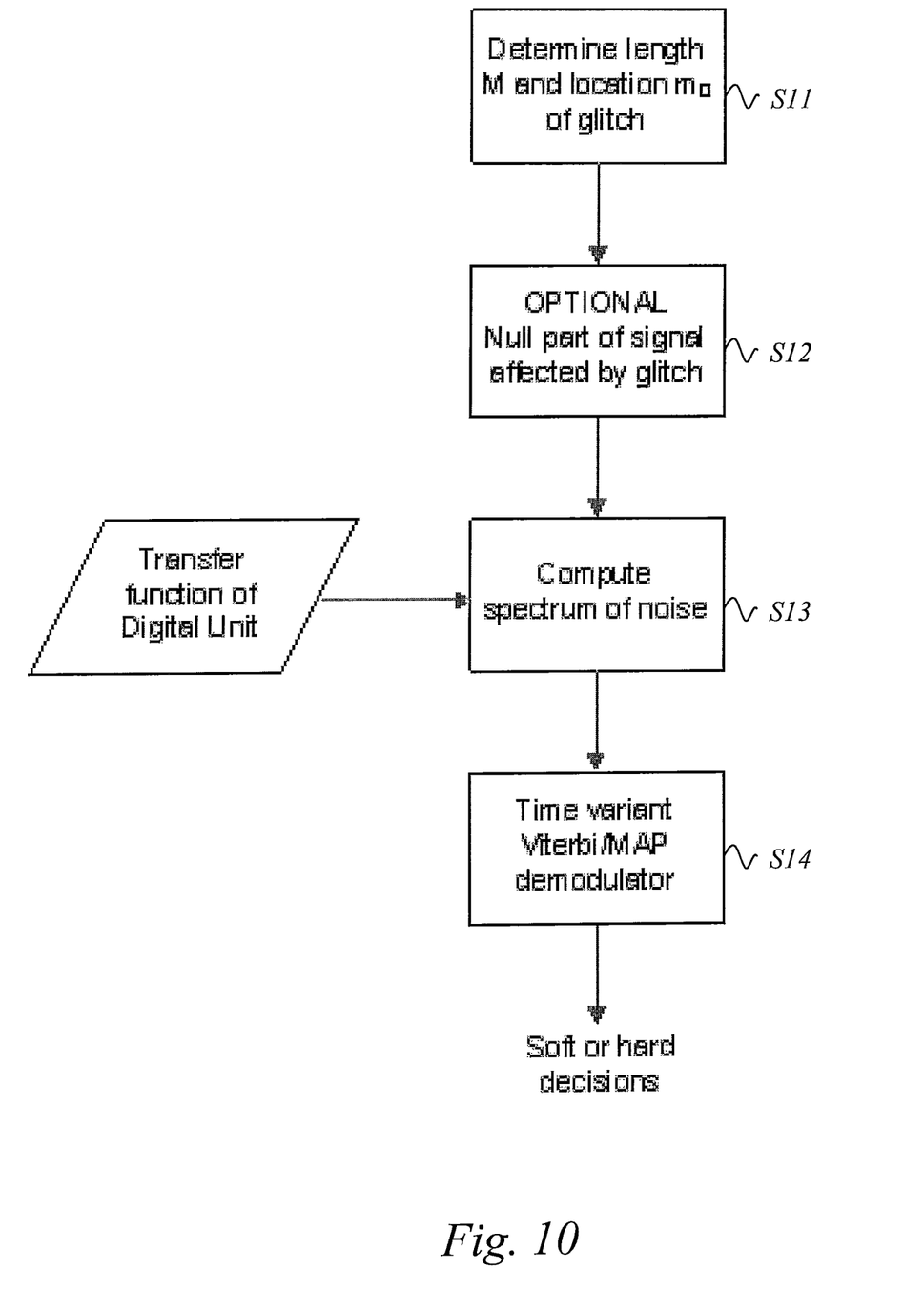
FIG. 10 is a schematic flow diagram of a specific example of a detection algorithm according to an exemplary embodiment.

FIG. 9 is a schematic block diagram illustrating a radio receiver according to an exemplary embodiment. The receiver basically comprises one or more antennas 110, an analog RF front end 120 including an AGC mechanism 122, and ADC 125, a digital unit 130 and a time-variant demodulator 140.

Let $\{\breve{y}_n\}_{n=0}^N$ be some discrete samples of the received signal before the AGC 122. In practice the signal before AGC may be analog and such sampling may not be performed. Nevertheless, there is no problem in modeling them as a mathematical artifact, each sample representing the value of the continuous time signal at a particular time instant. After the AGC has been turned on/off, M samples have been corrupted by the glitch, and this discrete signal may be written as:

$$\bar{y}_n = \begin{cases} \breve{y}_n, & n \neq m_0, \ldots, m_0 + M - 1 \\ \breve{y}_n + \gamma_n, & n = m_0, \ldots, m_0 + M - 1, \end{cases} \quad (1)$$

where $\{\gamma_m\}_{m=m_0}^{m_0+M-1}$ denotes the effect of the glitch, and $m_0$ indicates the start of the glitch. Note that both the location $m_0$ and length M of the glitch have been determined (S11), see FIG. 10.

In a first variant, the part of the signal affected by the glitch is first nulled or damped (S12) below the noise floor by the analog front end, so-called glitch damping or glitch suppression. See for example reference [1]. After analog-to-digital conversion by the ADC 125 the digital signal denoted $\{y_n\}_{n=0}^N$ is defined by:

$$y_n = \begin{cases} \bar{y}_n, & n \neq m_0, \ldots, m_0 + M - 1 \\ 0, & n = m_0, \ldots, m_0 + M - 1. \end{cases} \quad (2)$$

Let $\{f_n\}_{n=0}^L$ denote the cascade of filters applied during digital signal processing of the received signal in the digital unit 130, up to the input of the demodulator 140. If all the filters are linear time invariant, then the cascade is equivalent to the convolution of all the individual filters. Typical filters present in a digital receiver include the channel filter, whitening filters, impulse response shaping filters and others. We shall also define $f_n=0$ if $n>L$ or $n<0$.

Hence, the baseband received signal $\{z_n\}$ may be written as:

$$z_n = \sum_{k=0}^L f_k y_{n-k}. \quad (3)$$

On the other hand the following general baseband model of the received signal is also valid if there is no glitch:

$$z_n = \sum_{k=0}^P h_k s_{n-k} + w_n, \quad (4)$$

where $s_n$ denote the transmitted symbols, $\{h_n\}_{n=0}^P$ models the P-tap radio channel (i.e. the transmitter filters, multipath propagation, receive filtering, etc.) and $w_n$ represents a noise sample with var $(w_n)=\sigma_w^2$.

Since $y_m=0$, $m=m_0, \ldots, m_0+M-1$, it follows from (2) and (3) that:

$$z_{m_0+i} = \sum_{k=0}^L f_k \bar{y}_{m_0+i-k} - (f_i \bar{y}_{m_0} + \ldots + f_{i-M+1} \bar{y}_{m_0+M-1}) \quad (5)$$

$$= \sum_{k=0}^P h_k s_{m_0+i-k} + w_{m_0+i} - (f_i \bar{y}_{m_0} + \ldots + f_{i-M+1} \bar{y}_{m_0+m-1}).$$

What (5) says is that we may use the usual baseband model for the signal when no AGC is present, but with some corrections due to the fact that some samples have been nulled and afterwards the signal has been filtered.

Defining:

$$\delta_i = \sum_{k=0}^{M-1} f_{i-k} \bar{y}_{m_0+k}, \quad (6)$$

equation (5) may be re-written as:

$$z_{m_0+i} = \sum_{k=0}^P h_k s_{m_0+i-k} + w_{m_0+i} - \delta_i. \quad (7)$$

Next, define the autocorrelation:

$$\rho(i) = E[\breve{y}_m^* \cdot \breve{y}_{m+i}] \quad (8)$$

where E denotes the well-known expected value operator. The autocorrelation given by equation (8) is easy to estimate over the samples that have not been affected by the glitch.

From equations (6) and (8) the spectrum of $\delta_i$ can be computed (S13). We shall concentrate on the variance as an appropriate representation of the spectrum since it is enough to get a good approximation of the optimum receiver.

Indeed, for $i=0, \ldots, L+M-1$:

$$E[|\delta_i|^2] = E\left[\left(\sum_{k=0}^{M-1} f_{i-k} \bar{y}_{m_0+k}\right)^* \left(\sum_{k=0}^{M-1} f_{i-k} \bar{y}_{m_0+k}\right)\right] \quad (9)$$

$$= \sum_{k=0}^{M-1} |f_{i-k}|^2 E[|\bar{y}_{m_0+k}|^2] + 2 \sum_{k=1}^{M-1} \sum_{j=0}^{\lfloor k/2 \rfloor} \mathcal{R}e\{f_{i-k}^* f_{i-k+j} \rho(j)\}.$$

M is typically small. For example, for M=2, (9) yields:

$$E[|\delta_i|^2] = (|f_i|^2 + |f_{i-1}|^2)\rho(0) + 2\mathcal{R}e\{f_i^* f_{i-1} \rho(1)\}. \quad (10)$$

The following rough approximation may be useful in practice:

$$E[|\delta_i|^2] \approx (|f_i|^2 + |f_{i-1}|^2)\rho(0). \quad (11)$$

Define $\tau_i^2 = E[|\delta_i|^2]$. Since $\delta_i$ and $w_n$ are independent, we may rewrite (7) in the form:

$$z_{m_0+i} = \sum_{k=0}^{P} h_k s_{m_0+i-k} + \varepsilon_{m_0+i}. \quad (12)$$

In (12) the noise term $\varepsilon_{m_0+i}$ has variance $\sigma_w^2 + \tau_i^2$ if $i=0, \ldots, L+M-1$ and $\sigma_w^2$ otherwise.

Optimum receivers for stationary signals of the form given by equation (4), in terms of sequence or symbol estimation, are the Maximum Likelihood Sequence Estimator (MLSE) or the MAP receiver, e.g. see references [2], [3], and [4]. Both algorithms traverse a trellis computing the cost of the transitions between different states. The states are defined by tuples of transmitted symbols:

$$S_\mu = (s_{\mu-P+1}, \ldots, s_\mu), \quad (13)$$

and the cost or metric increment of a transition between states is given by:

$$\lambda(S_{\mu-1}, S_\mu) = \frac{\left|z_\mu - \sum_{k=0}^{P} h_k s_{\mu-k}\right|^2}{\sigma_w^2}. \quad (14)$$

Moreover, since $\sigma_w^2$ is constant, the variance can be factored out of the metric (14) and the ordinary Euclidean distance is obtained:

$$\overline{\lambda}(S_{\mu-1}, S_\mu) = \left|z_\mu - \sum_{k=0}^{P} h_k s_{\mu-k}\right|^2. \quad (15)$$

References [2] and [3] present the derivation of the algorithm (and some simplified versions) for the stationary case. However, in our non-stationary case equations (14) or (15) are not valid any more. The derivation of the metric in the non-stationary case is more complex and tedious but it can be performed if the noise is assumed Gaussian with some known covariance matrix. This covariance matrix can be computed from equation (6). However, with the simplifying assumption that the noise samples are independent in time, the following low complexity variant of equation (15) is obtained:

$$\tilde{\lambda}(S_{m_0+i-1}, S_{m_0+i}) = \quad (16)$$

$$\begin{cases} \left|z_{m_0+i} - \sum_{k=0}^{P} h_k s_{m_0+i-k}\right|^2 \cdot \left(\frac{1}{1 + \frac{\tau_i^2}{\sigma_w^2}}\right), & i = 0, \ldots, L+M-1 \\ \left|z_{m_0+i} - \sum_{k=0}^{P} h_k s_{m_0+i-k}\right|^2, & i < 0 \text{ or } i > L+M-1 \end{cases}$$

The time varying metric of equation (16) can be applied in a straightforward manner to the Viterbi or MAP algorithms (S14) described in references [2] and [3], or to any other trellis based detectors such as the Soft Output Viterbi Algorithm (SOVA).

Note that equation (16) is not equivalent to Viterbi/MAP based on equation (15) modified with time varying soft scaling. The use of the modified metric of equation (16) leads to a different maximum likelihood path and different log-likelihood ratios than Viterbi/MAP based on equation (15).

Use of the time-varying Viterbi/MAP with metric (16) results in greatly improved performance.

The output for the time-variant demodulator may then be sent for soft or hard decisions, depending on the desired implementation.

In an alternative embodiment, the samples affected by the glitch are not nulled or damped. If the glitch terms $\{\gamma_m\}_{m=m_0}^{m_0+M-1}$ were known, the analysis and computation performed above may be followed in a like manner, and a variant of equation (16) is also obtained. If the desired signal has low energy compared to the glitch, one may assume that $\breve{y}_n = \gamma_n$, $n = m_0, \ldots, m_0 + M - 1$. In this case equation (2) must be replaced by:

$$y_n = \begin{cases} \overline{y}_n, & n \neq m_0, \ldots, m_0 + M - 1 \\ \gamma_n, & n = m_0, \ldots, m_0 + M - 1. \end{cases} \quad (17)$$

The terms are given by known values (instead of zero), and the calculations (3)-(16) require only slight but tedious modifications. In general, it is necessary to guess the glitch terms using ad-hoc methods, and therefore this second variant is not as straightforward as the previously described first variant.

The embodiments described above are to be understood as a few illustrative examples of the present invention. It will be understood by those skilled in the art that various modifications, combinations and changes may be made to the embodiments without departing from the scope of the present invention. In particular, different part solutions in the different embodiments can be combined in other configurations, where technically possible. The scope of the present invention is, however, defined by the appended claims.

REFERENCES

[1] Co-pending U.S. Patent Application No. 61/155,671, filed Feb. 26, 2009.
[2] Koch, W. and Baier, A. "Optimum and sub-optimum detection of coded data disturbed by time varying intersymbol interference", GLOBECOM 90, IEEE Volume, Issue, 2-5 Dec. 1990 Page(s): 1679-1684 vol. 3.
[3] Viterbi, A. J., "An intuitive justification and a simplified implementation of the MAP decoder for convolutional codes", IEEE Journal of Selected Areas in Communications, Vol. 16, No 2, February 1998.
[4] Jürgen Häring and A. J. Han Vinck "Performance Bounds for Optimum and Suboptimum Reception under Class-A Impulsive Noise", IEEE Transactions on Communications, Vol. 50, No. 7, July 2002.

The invention claimed is:

1. A method for detecting a radio signal in a receiver having an automatic gain control (AGC) mechanism for regulating the dynamic range of the received signal, comprising:
   determining an occurrence of a glitch caused by operation of the AGC mechanism;
   estimating a representation of how energy of a signal transient associated with the glitch is transferred by at least one digital filter in the receiver; and demodulating said radio signal using the estimated representation, wherein said radio signal is a narrowband signal received through a wideband radio receiver.

2. The method of claim 1, wherein estimating the representation of how energy of the signal transient associated with the glitch is transferred by the at least one digital filter includes estimating an approximation of a glitch-related non-stationary noise spectrum.

3. The method of claim 1, wherein said signal transient includes at least one of i) the glitch and ii) a signal transient caused by processing the glitch in said receiver.

4. The method of claim 3, further comprising processing the glitch in said receiver, and said signal transient includes a signal transient caused by the processing of the glitch in said receiver.

5. The method of claim 4, wherein processing the glitch in said receiver includes glitch damping, wherein said glitch damping at least partly contributes to said signal transient.

6. The method of claim 3, wherein said signal transient includes the glitch caused by operation of the AGC mechanism.

7. The method of claim 1, wherein determining the occurrence of the glitch is performed in response to an AGC adjustment of the AGC mechanism.

8. The method of claim 1, wherein determining the occurrence of the glitch is performed by a glitch detector arranged externally to the AGC mechanism.

9. The method of claim 1, wherein said narrowband signal is a Global System for Mobile communications (GSM) signal received through a wideband radio receiver capable of receiving Wideband Code Division Multiple Access (WCDMA) or Long Term Evolution (LTE) radio signals.

10. A detector operable to detect a radio signal in a receiver having an automatic gain control (AGC) mechanism for regulating the dynamic range of the received signal, said detector being adapted to obtain information representative of how energy of a signal transient associated with a glitch, caused by operation of the AGC mechanism, is transferred by at least one digital filter in the receiver, and adapted to demodulate said radio signal using the obtained information, wherein said radio signal is a narrowband signal received through a wideband radio receiver.

11. The detector of claim 10, wherein the obtained information includes an approximation of a glitch-related non-stationary noise spectrum.

12. The detector of claim 10, wherein said signal transient includes at least one of i) the glitch and ii) a signal transient caused by processing the glitch in said receiver.

13. The detector of claim 10, wherein said detector has an input for receiving said information representative of how energy of a signal transient associated with a glitch is transferred by at least one digital filter.

14. The detector of claim 10, wherein said detector includes an estimator to estimate a representation of how energy of a signal transient associated with the glitch is transferred by the at least one digital filter.

15. The detector of claim 10, wherein said detector includes a time-dependent demodulator to demodulate the received radio signal.

16. The detector of claim 10, wherein said detector includes one of a time-dependent maximum-a-posteriori detector and a time-dependent Viterbi detector.

17. The detector of claim 10, wherein said narrowband signal is a Global System for Mobile communications (GSM) signal received through a wideband radio receiver capable of receiving Wideband Code Division Multiple Access (WCDMA) or Long Term Evolution (LTE) radio.

18. A radio receiver comprising:
an analog radio frequency (RF) front end having an automatic gain control (AGC) mechanism to regulate the dynamic range of a received signal, wherein said received signal is a narrowband signal received through a wideband radio receiver;
an analog-to-digital (A/D) converter to convert output signals from said analog RF front end into digital form;
a digital processing unit including at least one digital filter in the output path of the A/D converter;
an estimator adapted to estimate a representation of how energy of a signal transient associated with a glitch, caused by operation of the AGC mechanism, is transferred by the at least one digital filter in the digital processing unit; and
a detector, in the output path of the digital processing unit, configured to demodulate the received signal using the estimated representation of how energy of the signal transient associated with the glitch is transferred by the at least one digital filter.

19. The radio receiver of claim 18, wherein said estimator is adapted to estimate an approximation of a glitch-related noise spectrum.

20. The radio receiver of claim 18, wherein said signal transient includes at least one of i) the glitch and ii) a signal transient caused by processing the glitch in said receiver.

21. The radio receiver of claim 20, wherein said radio receiver further comprises a glitch processing unit to process the glitch in said receiver, and said signal transient includes a signal transient caused by the processing of the glitch in said receiver.

22. The radio receiver of claim 21, wherein said glitch processing unit is adapted to dampen the glitch, wherein said damping at least partly contributes to said signal transient.

23. The radio receiver of claim 20, wherein said signal transient includes the glitch caused by operation of the AGC mechanism.

24. The radio receiver of claim 18, wherein said radio receiver further comprises a determiner to determine occurrence of a glitch in response to an AGC adjustment of the AGC mechanism, and to transfer information representative of the occurrence of a glitch to said estimator.

25. The radio receiver of claim 18, wherein said radio receiver further comprises a glitch detector arranged externally to the AGC mechanism, and said glitch detector is adapted to transfer information representative of detection of a glitch to said estimator.

26. The radio receiver of claim 18, wherein said detector includes a time-dependent demodulator.

27. The radio receiver of claim 18, wherein said narrowband signal is a Global System for Mobile communications (GSM) signal received through a wideband radio receiver capable of receiving Wideband Code Division Multiple Access (WCDMA) or Long Term Evolution (LTE) radio.

* * * * *